United States Patent [19]

Fang et al.

[11] Patent Number: 5,407,532

[45] Date of Patent: Apr. 18, 1995

[54] SELF-ALIGNED METHOD OF FABRICATION CLOSELY SPACED APART METALLIZATION LINES

[75] Inventors: San-Chin Fang, New Providence; Nadia Lifshitz, Bridgewater, both of N.J.

[73] Assignee: AT&T Corp., Murray Hill, N.J.

[21] Appl. No.: 146,624

[22] Filed: Oct. 29, 1993

Related U.S. Application Data

[63] Continuation of Ser. No. 903,684, Jun. 24, 1992, abandoned.

[51] Int. Cl.[6] .......................................... H01L 21/312
[52] U.S. Cl. ...................................... 156/656; 437/50; 437/52; 437/194; 437/195
[58] Field of Search ................. 437/228, 194, 195, 52, 437/924, 50; 156/656

[56] References Cited

U.S. PATENT DOCUMENTS

| 5,030,587 | 7/1991 | Wald et al. | 437/52 |
| 5,073,510 | 12/1991 | Kwon et al. | 437/40 |
| 5,084,406 | 1/1992 | Rhodes et al. | 437/52 |
| 5,100,817 | 3/1992 | Cederbaum et al. | 437/200 |
| 5,100,838 | 3/1992 | Dennison | 437/50 |
| 5,158,898 | 10/1992 | Hayden et al. | 437/228 |
| 5,170,243 | 12/1992 | Dhong et al. | 257/304 |
| 5,270,240 | 12/1993 | Lee | 437/52 |

OTHER PUBLICATIONS

Wolf, Silicon Processing for the VLSI Era, vol. 2, Lattice Press Sunset Beach, 1990, pp. 190–192.

Primary Examiner—Brian E. Hearn
Assistant Examiner—Trung Dang
Attorney, Agent, or Firm—David I. Caplan

[57] ABSTRACT

Parallel metallization lines for a substrate of an electronic device, such as complementary bit (B and $\overline{B}$) lines for an SRAM cell array, are formed by:

forming a uniformly thick aluminum layer with an underlying and overlying dielectric oxide layer, the underlying oxide layer being located overlying the substrate, patterning the overlying oxide and the aluminum layers to form the aluminum bit line (B) with an overlying dielectric oxide layer on its top surface, typically by means of reactive ion etching, depositing a further dielectric oxide layer on the entire surface of the structure including the sidewalls of the aluminum bit line (B), and reactive ion etching the top surface of the oxide layer, whereby an oxide layer remains on the top and sidewall surfaces of the aluminum bit line (B) but not elsewhere.

Subsequent forming of a second uniformly thick aluminum layer on the top surface of the structure that is being fabricated, followed by patterning this second aluminum layer, forms the complementary aluminum bit line ($\overline{B}$).

19 Claims, 2 Drawing Sheets

SELF-ALIGNED METHOD OF FABRICATION CLOSELY SPACED APART METALLIZATION LINES

This application is a Continuation of application Ser. No. 07/903684 filed on Jun. 24, 1992, now abandoned.

FIELD OF THE INVENTION

This invention relates to methods of making integrated circuit devices and more particularly to methods of making electrically conducting lines for such devices.

BACKGROUND OF THE INVENTION

In the fabrication of integrated circuit devices, such as an array of semiconductor static random access memory (SRAM) cells, one of the crucial technological issues is the fabrication of parallel electrically conducting metallization lines having a spatial periodicity that is as small as possible, in order to conserve semiconductor chip space. In prior art, this periodicity is ordinarily limited by the smallest feature obtainable by means of standard photolithography techniques, of masking and etching to fore all be desired metallization lines simultaneously. However, because of the non-vanishing wavelength of the light used for such photolithography, the spacing S between adjacent lines is, in present technology, at least approximately 0.4 $\mu$m unless advanced techniques like phase-shifting or direct-writing lithography be used, which can be undesirable.

When using aluminum for the metallization lines, in present technology the width of each line should be no less than approximately 0.7 $\mu$m to 0.9 $\mu$m, preferably approximately 1.0 $\mu$m, lest electromigration effects due to high electrical current density flowing in the lines during operation of the device cause voids (gaps) to form in the lines and hence cause undesirable open circuits in the device, and lest stress in the aluminum also cause undesirable voids therein. Thus, the spatial periodicity of the lines preferably is approximately equal to at least $(1.0+0.4)$ $\mu$m $= 1.4$ $\mu$m. In the case of an SRAM cell, for example, having an aluminum bit line B and a parallel, complementary aluminum bit line $\overline{B}$, the width of each SRAM cell preferably is thus approximately equal to at least $2 \times 1.4$ $\mu$m $= 2.8$ $\mu$m, although smaller widths can be made at some sacrifice of reliability due to electromigration and open circuits. It would therefore be desirable to have a method of reducing the spatial periodicity of metallization lines, and hence of conseling chip space, and thus, for example, of enabling an increase the number of SRAM cells per unit area of the chip.

SUMMARY OF THE INVENTION

In accordance with the invention, a semiconductor device comprises two or more metallization lines which are formed by means of:

(a) forming a first electrically conducting layer on a first insulating layer located on an underlying device such as a semiconductive substrate that contains impurity-doped regions;

(b) forming a second insulating layer on the first conducting layer;

(c) anisotropically etching a selected first portion of the second insulating layer and the underlying first portion of the first conducting layer, whereby the underlying first portion of the first insulating layer become exposed, and whereby the second portion of the first conducting layer forms a patterned first conducting layer and whereby a second portion of the second insulating layer remains intact on the top surface of the patterned first conducting layer;

(d) forming a third insulating layer covering at least the second portion of the second insulating layer and the sidewalls of the portion of the patterned first conducting layer;

(e) anisotropically etching the third insulating layer to remove it everywhere except on the sidewalls of the patterned first conducting layer, whereby at least a portion of the thickness of the third insulating layer remains intact everywhere on the sidewalls of the patterned first conducting layer, and whereby at least a portion of the thickness of the second insulating layer remains intact on the top surface of the patterned first conducting layer; and (f) forming a patterned second electrically conducting layer at least on the exposed first portion of the first insulating layer.

It is also advantageous that step (f) be performed by depositing a second conducting layer both on the first portion of the first insulating layer and on the intact portion of the second insulating layer followed by patterning the second conducting layer to form the patterned second conducting layer. It is further advantageous to form first and second apertures in the first insulating layer, followed by depositing a separate respective first and second electrically conducting plug in each of these apertures, respectively, prior to step (a). It is yet further advantageous that the apertures penetrate through the first insulating layer down to the substrate, whereby both the first and the second plugs are contiguous with the substrate. It is yet further advantageous that the second portion of the first conducting layer is contiguous with a top surface of the first plug, and that the second conducting layer is contiguous with a top surface of the second plug. Typically, the first and second conducting layers comprise aluminum.

In this way harmful effects of any misalignment error in the patterning of the second conducting layer during step (f) relative to the patterning of the first conducting layer during step (c) are minimized, if not avoided. In this respect, the method of this invention is "self-aligned". Moreover, because the first and second patterned layers are thus made on a single level of metallization and can be made in the shape (top view) of mutually parallel stripes ("lines"), such as successive complementary B and $\overline{B}$ lines, the effective spacing S between adjacent lines (B and $\overline{B}$) is equal only to the thickness of the third insulating layer remaining intact on sidewalls of the patterned first conducting layers.

Moreover especially when using aluminum as the material for the second conducting layer, because of electromigration problems arising from electronic conduction in aluminum carrying a high electrical current density, as well as because of problems arising from voids in the aluminum due to stress therein, it is desirable that the second conducting layer be patterned so that it overlies (overlaps) at least a portion, if not all, of the third insulating layer remaining intact on the sidewalls of the patterned first conducting layer, and also overlies a portion of the second insulating layer remaining intact on the top surface of the patterned first conducting layer. In this way, the patterned second conducting can be made wider without sacrifice of small spatial periodicity of the metallization.

Only for the sake of clarity, none of the drawings is to scale.

DETAILED DESCRIPTION

Figure 1:
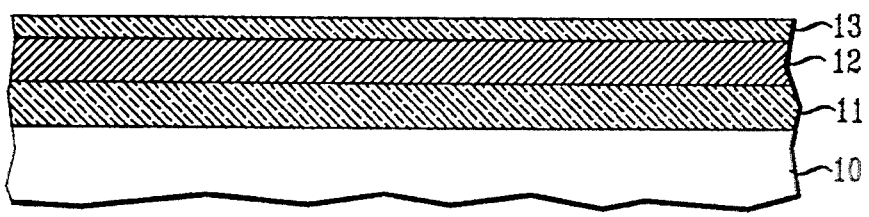
FIGS. 1–4 are cross-section side views of various stages in the fabrication of semiconductor integrated circuit metallization, in accordance with a specific embodiment of the invention.

Referring now to FIG. 1, upon a semiconducting silicon substrate 10 is deposited a silicon dioxide insulating layer 11 having a thickness typically in the approximate range of 0.6 $\mu$m to 1.0 $\mu$m. The substrate 10 typically contains localized electronic devices, such as transistors (not shown), for forming an integrated circuit. Typically the silicon dioxide layer 11 is formed by means of the process of low pressure chemical vapor deposition (LPCVD).

An aluminum layer 12 is deposited everywhere on the silicon dioxide layer 12, typically by means of sputtering, to a thickness of typically approximately 0.5 $\mu$m. On this aluminum layer another silicon dioxide layer 13 is deposited, typically by means of plasma enhanced, low temperature CVD (chemical vapor deposition), to a thickness of typically approximately 0.2 $\mu$m.

Figure 2:
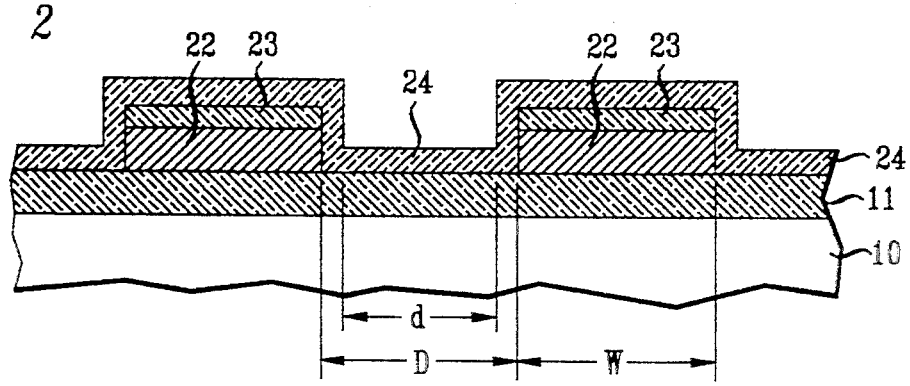

The silicon dioxide layer 13 and the aluminum layer 12 are then patterned, typically by means of standard reactive ion etching with etchants containing fluorine ions and chlorine ions, respectively. In this way (FIG. 2) a patterned silicon dioxide layer 23 and a patterned aluminum layer 22 are formed, respectively. Typically the patterned aluminum layer is in the shape (top view) of parallel stripes ("lines"). Between these adjacent stripes, portions of the silicon dioxide layer 11 thus become exposed. The width W each of the stripes 22 is typically made to be equal to approximately 1.0 $\mu$m, and the distance D between adjacent stripes 22 is typically made to be equal to approximately 1.0 $\mu$m.

Next, another insulating silicon dioxide layer 24 is deposited on the top surface of the structure-that is, on the top surface of the silicon dioxide layer 23, on the sidewalls of the patterned aluminum layer 22, and on the exposed portions of the substrate 10. Typically, the thickness t of this silicon dioxide layer 24 is made to be equal to approximately 0.2 $\mu$m. Thus the distance d remaining between the portions of the insulating layer 24 located on the sidewalls of adjacent stripes 22 is equal to (D−2t), i.e., typically approximately 0.6 $\mu$m.

The entire top surface of the structure is then subjected to another reactive ion etching with an etchant that contains fluorine ions. This etching advantageously is performed for a time duration that is sufficient to expose the portions of the silicon dioxide layer 11 located between the remaining sidewall oxide layers of adjacent aluminum stripes 22 but not to expose the top surfaces of these stripes. In this way, sidewall insulating layer 34 and top surface insulating layer 33 remain intact.

Figure 3:
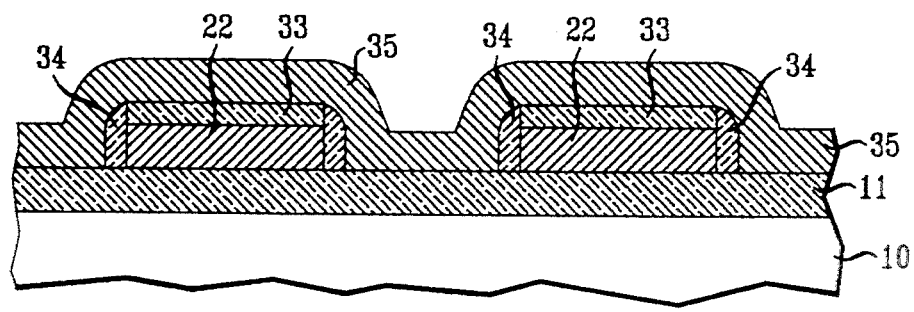

Then (FIG. 3) another aluminum layer 35 is deposited everywhere on the top surface of the structure, typically by the same (evaporation) method as used for depositing, and to the same thickness as that of, the aluminum layer 13. Next (FIG. 4), this aluminum layer 35 is patterned, typically into stripes 45 having a width w typically equal to approximately 1.0 $\mu$m, typically by means of the same method as that used for patterning the aluminum layer 12.

Figure 4:
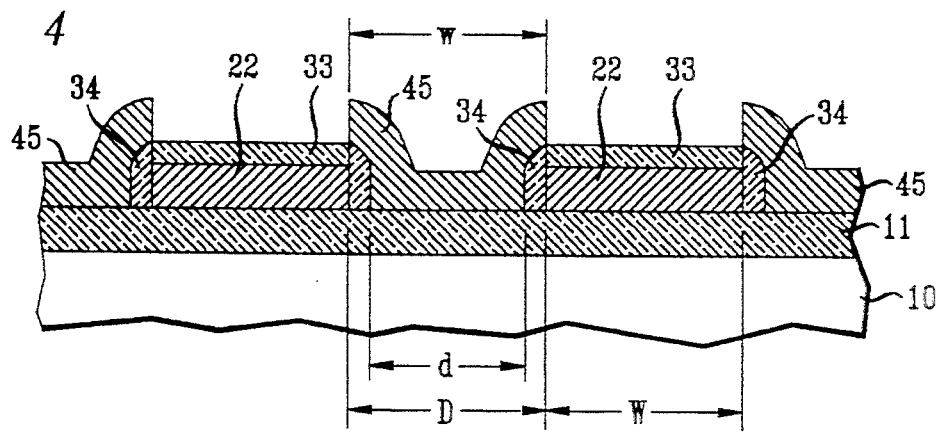

Advantageously, the width w of the stripes 45 is made to exceed the distance d, so that electromigration problems are relieved. Thus the stripes 45 are indicated in FIG. 4 as overlapping approximately the entire top surface of the sidewall insulating layer 34, whereby w is equal to approximately 0.6 $\mu$m+2×(0.2 $\mu$m)=1.0 $\mu$m—i.e., w=D, approximately. It should be understood, however, that this amount of overlapping is not necessary, in view of the added effective width of the stripes 45 owing to their vertical heights along the sidewall insulating layers 34. On the other hand, this overlapping of the aluminum stripes 45 can be greater—i.e., can extend over a portion of the insulating layer 33—to preserve the width of the aluminum stripes 45 and the same time reduce the distance d.

Figure 5:
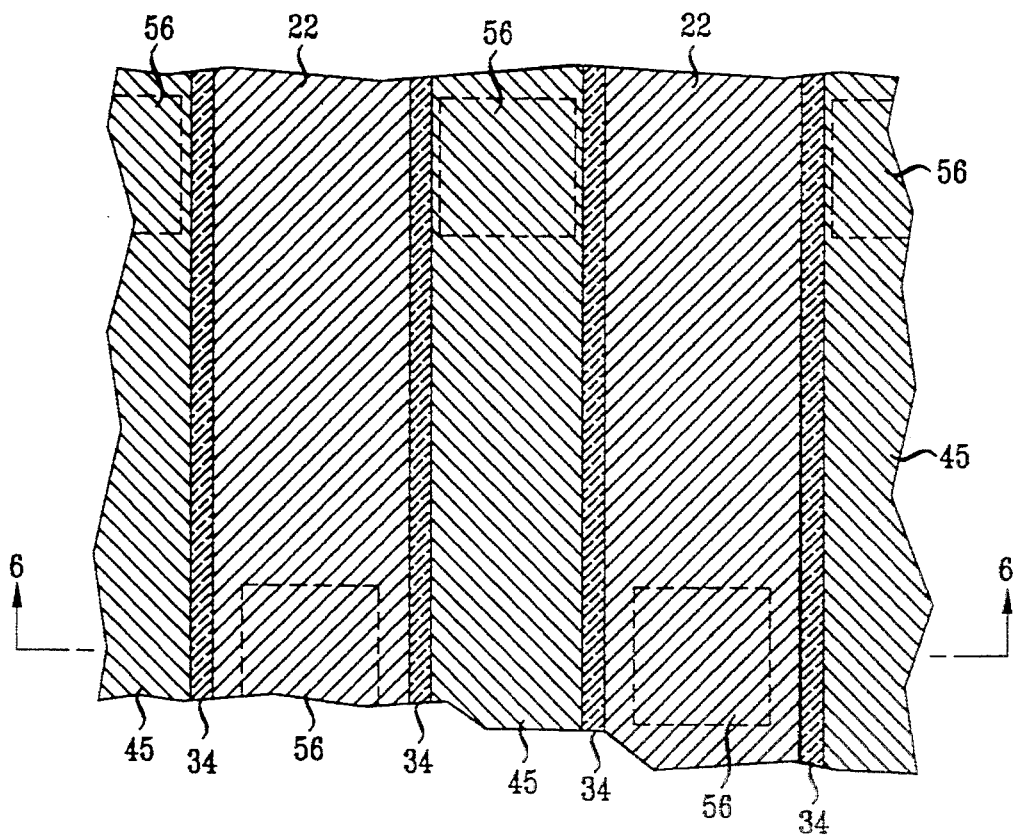
FIG. 5 is a top view, partly in cross-section, of semiconductor integrated circuit metallization, in accordance with another specific embodiment of the invention.
Figure 6:
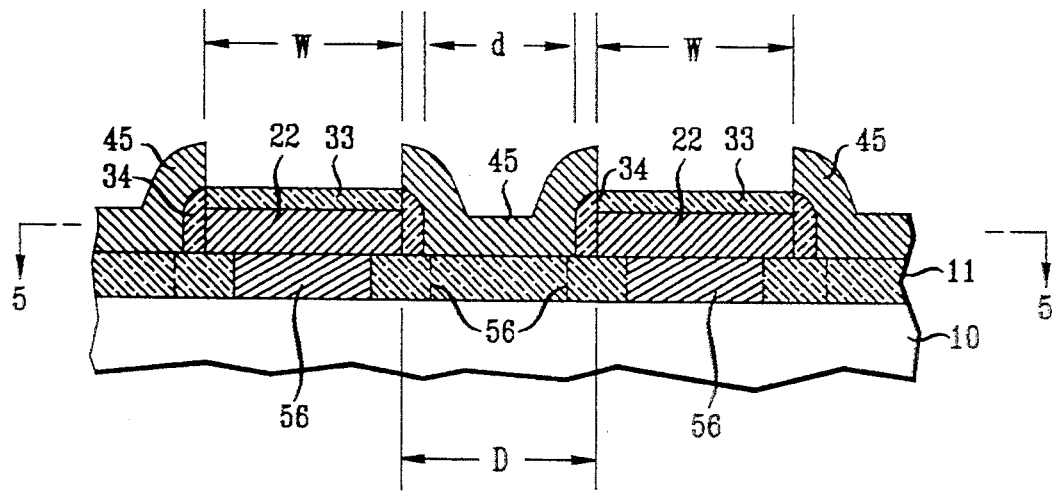
FIG. 6 is a cross-section side view of FIG. 5.

FIGS. 5 and 6 indicate how the metallization shown in FIG. 4 can be used for an SRAM cell or for an array of such cells. To this end, however, prior to deposition of the aluminum layer 12 (FIG. 1), apertures are cut into the insulating layer 11 and are filled with a conducting material, such as doped polysilicon, to form conducting plugs 56. Typically, the cross section of each of these plugs is approximately (0.5 $\mu$m)$^2$. Advantageously, these plugs 56 come into contact at their bottom surfaces with such elements as, for example, impurity-doped regions (not shown) of the silicon substrate 10. In this way, an SRAM cell array that has its bit lines (B) supplied by the stripes 45 and its complementary bit lines ($\overline{B}$) supplied by the stripes 22 can be formed by known procedures for forming SRAM cell arrays in the substrate 10. The width of each cell will thus be equal to (D+W), that is, typically approximately (1.0 $\mu$m+1.0 $\mu$m)=2.0 $\mu$m in accordance with the abovedescribed procedure—instead of the 1.0 $\mu$m+1.0 $\mu$m+2×(0.4 $\mu$m)=2.8 $\mu$m that would otherwise be required using standard techniques for 0.4 $\mu$m photographically-limited feature size for separating equally wide aluminum stripes.

Although the invention has been described in detail with respect to specific embodiments, various modifications can be made without departing from the scope of the invention. For example, the stripes 22 and 45 can be used for metallizing arrays or interconnecting devices other than SRAM cells. In addition, the aluminum layers can be deposited onto electrically conducting adhesive layers—such as titanium nitride or titanium/tungsten—which have been deposited prior to, and hence underlie, the aluminum layers. In such cases, these adhesive layers ultimately become part of the patterned electrically conducting layers. Instead of aluminum, other metallic or metal-like materials can be used—such as copper or a metal silicide.

We claim:

1. A method of electrically connecting a plurality of semiconductor devices integrated in a semiconductive substrate comprising the steps of:
    (a) forming a first insulating layer on a major surface of the substrate;
    (b) forming a first electrically conducting layer on the first insulating layer;
    (c) forming a second insulating layer on the first conducting layer;

(d) anisotropically etching a selected elongated parallel stripe portion of the second insulating layer and an elongated parallel stripe portion of the first conducting layer underlying the elongated parallel stripe portion of the second insulating layer, whereby an elongated parallel stripe portion of the first insulating layer becomes exposed and a first patterned conducting layer having at least a pair of elongated parallel stripes is formed, and whereby an elongated parallel stripe portion of the second insulating layer remains intact on the top surface of the first patterned conducting layer;

(e) forming a third insulating layer covering at least the elongated parallel stripe portion of the second insulating layer and the sidewalls of the first patterned conducting layer;

(f) anisotropically etching the third insulating layer to remove it everywhere except on the sidewalls of the elongated parallel stripes of the first patterned conducting layer, whereby at least a portion of the thickness of the third insulating layer remains intact everywhere on the sidewalls of the first patterned conducting layer, and whereby at least a portion of the thickness of the second insulating layer remains intact on the top surface of the first conducting layer; and (g) forming a second patterned electrically conducting layer, having at least a second pair of elongated parallel stripes that are parallel to and that alternate with the elongated parallel stripes of the first patterned conducting layer, on at least the exposed portion of the first insulating layer, whereby each of the elongated parallel stripes of the first conducting layer is laterally separated, along the major surface of the first insulating layer, from its adjacent elongated parallel stripe of the second conducting layer by, and only by, the portion of the thickness of the third insulating layer which remains intact on the sidewalls of the first patterned conducting layer.

2. The method of claim 1 in which step (g) is performed by depositing an unpatterned conducting layer both on the elongated portion of the first insulating layer and on the remaining intact portion of the second insulating layer, followed by patterning the unpatterned conducting layer to form the second patterned conducting layer.

3. The method of claim 2 further comprising, prior to step (a), the step of forming first and second apertures in the first insulating layer followed by depositing first and second electrically conducting plugs, respectively, in these apertures.

4. The method of claim 3 in which the first, patterned conducting layer is contiguous with the top of the first plug, and the patterned second conducting layer is contiguous with the top of the second plug.

5. The method of claim 4 in which both the first and the second patterned electrically conducting layers comprise aluminum, in which each of the devices comprises a static random access memory cells, and in which the first and second patterned conducting layers are complementary bit lines, respectively, each of which extends overlying and interconnects at least two of the devices.

6. The method of claim 3 in which both the first and the second patterned electrically conducting layers comprise aluminum, in which each of the devices comprises a static random access memory cell, and in which the first and second patterned conducting layers are complementary bit lines, respectively, each of which extends overlying and interconnects at least two of the devices.

7. The method of claim 2 in which both the first and the second patterned electrically conducting layers comprise aluminum, in which each of the devices comprises a static random access memory cell and in which the first and second patterned conducting layers are complementary bit lines, respectively, each of which extends overlying and interconnects at least two of the devices.

8. The method of claim 1 both the first and the second patterned electrically conducting layers comprise aluminum, in which each of the devices comprises a static random access memory cell, and in which the first and second patterned conducting layers are complementary bit lines, respectively, each of which extends overlying and interconnects at least two of the devices.

9. The method of claim 3 in which the first and second apertures penetrate through the first insulating layer down to the device, whereby both the first and the second plugs physically contact the substrate.

10. The method of claim 9 in which the first patterned conducting layer physically contacts the first plug, and the second patterned conducting layer physically contacts the second plug.

11. The method of claim 10 in which both the first and the second patterned electrically conducting layers comprise aluminum, in which each of the devices comprises a static random access memory cell, and in which the first and second patterned conducting layers are complementary bit lines, respectively, each of which extends overlying and interconnects at least two of the devices.

12. The method of claim 4 in which the first and second apertures penetrate through the first insulating layer down to the device, whereby both the first and the second plugs physically contact the substrate.

13. The method of claim 1, 2, 3, 4, 5, 9 or 10 in which the second patterned conducting layer overlies at least a portion of the top surface of the third insulating layer that remains intact on the sidewalls of the first patterned conducting layer.

14. The method of claim 13 in which the second patterned conducting layer overlies a portion of the elongated parallel stripe portion of the second insulating layer that remains intact on the top surface of the first patterned conducting layer.

15. The method of claim 1 in which both the first and the second patterned conducting layers comprise aluminum.

16. The method of claim 4 in which elongated stripes of the first and second conducting layers interconnect the devices.

17. The method of claim 3 in which elongated stripes of the first and second patterned conducting layers interconnect the devices.

18. The method of claim 2 in which elongated stripes of the first and second patterned conducting layers interconnect the devices.

19. The method of claim 1 in which elongated stripes of the first and second patterned conducting layers interconnect the devices.

* * * * *